United States Patent
Lee et al.

(10) Patent No.: US 7,030,799 B2
(45) Date of Patent: Apr. 18, 2006

(54) CURRENT-STEERING DIGITAL-TO-ANALOG CONVERTER

(75) Inventors: Seung-Chul Lee, Daejeon (KR);
Min-Hyung Cho, Daejeon (KR);
Chong-Ki Kwon, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 11/024,396

(22) Filed: Dec. 27, 2004

(65) Prior Publication Data

US 2006/0012501 A1   Jan. 19, 2006

(30) Foreign Application Priority Data

Jul. 16, 2004   (KR) .................. 10-2004-0055571

(51) Int. Cl.
*H03M 1/66* (2006.01)

(52) U.S. Cl. ..................... 341/144; 341/118

(58) Field of Classification Search .............. 341/136, 341/144, 119, 127, 118, 154; 330/253

See application file for complete search history.

(56) References Cited

U.S. PATENT DOCUMENTS

| | | | |
|---|---|---|---|
| 5,909,187 A * | 6/1999 | Ahuja | ...................... 341/136 |
| 6,667,703 B1 | 12/2003 | Reuveni et al. | |
| 6,703,956 B1 | 3/2004 | Mueller et al. | |
| 6,853,322 B1 * | 2/2005 | Dedic | ...................... 341/144 |
| 6,909,390 B1 * | 6/2005 | Khoini-Poorfard et al. | . 341/144 |
| 6,927,714 B1 * | 8/2005 | Teterwak | ................ 341/136 |

OTHER PUBLICATIONS

John Hyde, et al. "A 300-MS/s 14-bit Digital-to-Analog Converter in Logic CMOS", IEEE Journal of Solid-State Circuits, vol. 38, No. 5, May 2003.

Yonghua Cong, et al. "A 1.5-V 14-Bit 100-MS/s Self-Calibrated DAC", IEEE Journal of Solid-State Circuits, vol. 38, No. 12, Dec. 2003.

* cited by examiner

*Primary Examiner*—Brian Young
(74) *Attorney, Agent, or Firm*—Blakely Sokoloff Taylor & Zafman

(57) ABSTRACT

Disclosed is a current-steering digital-to-analog converter (DAC) which comprises a decoder for receiving an N-bit digital input signal and converting the same into first and second (N−1)-bit digital signals, M ($=2^{N-1}$) current cells for supplying the current based on the two digital signals, a current cell driver for generating a first analog voltage and a second analog voltage corresponding to the currents based on the two (N−1)-bit digital signals by control of a first clock signal and a second clock signal, and an amplifying circuit for sampling and holding the first and second analog voltage with reference to the first and second clock signals to generate a glitch-removed signal.

16 Claims, 6 Drawing Sheets

FIG.4

Case I ) $D_{IN}$ = 10010011

|  | $D_{IN1}$ | $D_{IN2}$ |
|---|---|---|
| $Q_1$ | 1001001 | 1 |
| $Q_2$ | 0110110 | 0 |

Case II ) $D_{IN}$ = 10010010

|  | $D_{IN1}$ | $D_{IN2}$ |
|---|---|---|
| $Q_1$ | 1001001 | 0 |
| $Q_2$ | 0110110 | 0 |

FIG.6

Case I ) $D_{IN}$ = 10010011

|  | $D_{IN1}$ | $-D_{IN1}$ | $D_{IN2}$ | $-D_{IN2}$ |
|---|---|---|---|---|
| $Q_1$ | 1001001 | 0110110 | 0 | 0 |
| $Q_2$ | 0110110 | 1001001 | 0 | 1 |

Case II ) $D_{IN}$ = 10010010

|  | $D_{IN1}$ | $-D_{IN1}$ | $D_{IN2}$ | $-D_{IN2}$ |
|---|---|---|---|---|
| $Q_1$ | 1001001 | 0110110 | 0 | 0 |
| $Q_2$ | 0110110 | 1001001 | 0 | 0 |

CURRENT-STEERING DIGITAL-TO-ANALOG CONVERTER

CROSS REFERENCE TO RELATED APPLICATION

This application claims priority to and the benefit of Korea Patent Application No. 10-2004-55571 filed on Jul. 16, 2004 in the Korean Intellectual Property Office, the entire content of which is incorporated herein by reference.

BACKGROUND OF THE INVENTION (a) Field of the Invention

The present invention relates to a digital to analog converter (DAC). More specifically, the present invention relates to a current-steering DAC for one bit extension irrespective of mismatch between current elements.

(b) Description of the Related Art

As the VLSI technique has greatly developed, element integrity within a chip has been improved to allow a system on a board to be integrated as a system on a chip. Accordingly, as digital signal processing techniques have recently been enhanced, digital signal processing communication systems such as high-definition TVs, digital TVs, CDPs, digital camcorders, beepers, and cell phones have been substantially developed. In particular, the importance of DACs for converting signals processed by digital circuits in the digital communication system into analog signals has been highlighted.

For example, a transmitter of a radio communication system requires a DAC which supports an excellent dynamic characteristic and prevents reduction of an SNR and distortions of signals. Also, it is needed for all the systems to have a very low power consumption characteristic according to the trend of highly integrated circuits.

The DACs are classified as audio DACs and video DACs. The audio DACs use a sigma-delta converter for realizing high resolution of greater than 16 bits, and the video DACs for digital TVs, video conference systems, and medical video signal processing systems use a current-matrix converter for high-speed resolution. The above-described current-steering DACs are mainly used for high-speed and high-resolution applications because of high speed and high operational rates. Also, intermediate- and low-speed DACs with a ladder structure are applied to portable instruments, industrial mechanical controllers, and digital control amplifiers.

In detail, the DACs are categorized as: decoder-based DACs for receiving N digital input signals, generating 2N reference signals by using a decoder, combining the reference signals into predetermined signals which correspond to the inputs, and outputting analog signals; binary weighted array DACs for assigning appropriate weights in the current, voltage, and charge formats to the binary signals, and arranging the weighted binary signals to generate desired analog signals; resistor-capacitor array DACs for using the advantages of the decoder-based DACs and binary weighted array DACs; and thermometer code based DACs. Recently, in order to achieve high-speed and excellent monotonous increase and low glitch energy, transactions which describe the current-steering division DACs or fully thermometer code schemes for dividing data into low data and high data, applying the binary weighted method to the low bits, and applying the thermometer code method to the high bits have been published.

For example, as to the thermometer code, the number '1' is represented to be '000001' in the 6-bit digital signal and is converted to be '000001' in the thermometer code format, the number '2' is represented to be '000010' in the 6-bit digital signal and is converted to be '000011' in the thermometer code format, and the number '3' is represented to be '000011' in the 6-bit digital signal and is converted to be '000111' in the thermometer code format. That is, the thermometer code is increased step by step, and better linearity is obtained by applying an appropriate current to each code to control one code to be changed when the code is increased by one step.

Regarding prior art, U.S. application No. U.S. Pat. No. 6,667,703B1 filed on Aug. 30, 2002 discloses "Matching Calibration for Digital-to-analog Converter" for calibrating mismatch by using an ADC with better resolution than the DAC to be realized in order to overcome the restricted resolution caused by mismatch in the current-steering DAC. The above-noted prior art uses the ADC with resolution higher than that of the DAC to be realized for the purpose of improving the resolution of a plurality of bits, thus substantially increasing additional power consumption and an area for an additional circuit.

As to second prior art, U.S. application No. U.S. Pat. No. 6,703,956B1 filed on Jan. 8, 2003 discloses "Technique for Improved Linearity of High-precision, Low-current Digital-to-analog Converter" for dividing current cells to increase mismatched degrees of current cells which form a current-steering DAC for the purpose of bit extension of the current-steering DAC.

As to third prior art, the transaction of entitled "A 300-MS/s 14-bit Digital-to-Analog Converter in Logic CMOS" IEEE JSSC vol. 38, no. 5, pp. 734–740, May 2003 discloses a method for measuring mismatch of a DAC and trimming current cells in order to overcome the restricted resolution caused by mismatch of elements in the current-steering DAC.

As to fourth prior art, the transaction of entitled "A 1.5-V 14-bit 100-MS/s Self-Calibrated DAC" IEEE JSSC vol. 38, no. 12, pp. 2,051–2,060, December 2003 discloses a method for using the ADC with a resolution higher than that of the DAC to be realized for the purpose of improving the resolution of a plurality of bits, thereby increasing additional power consumption and an area for an additional circuit.

The resolution can be restricted because of element mismatch between current cells in the above-noted current-steering DACs. Further, the matching characteristic between current cells is to be increased by more than twice for extension of an additional one bit, which increases the area occupied by current cell related circuits by four times to thus increase a required area and power consumption and degrade operational performance. In particular, complexity of the decoding block for converting binary code signals into thermometer code signals and thus minimizing glitches generated at an output terminal of the converter depending on the variation of input digital signals is increased to increase the required area and power consumption.

SUMMARY OF THE INVENTION

It is an advantage of the present invention to provide a current-steering DAC for extending the resolution of the existing current-steering DAC and reducing power consumption.

In one aspect of the present invention, a current-steering digital-to-analog converter (DAC) comprises: a decoder for receiving an N-bit digital input signal and converting the same into first and second (N−1)-bit digital signals; M ($=2^{N-1}$) current cells for supplying the current based on the two digital signals; a current cell driver for generating a first analog voltage and a second analog voltage corresponding to the currents based on the two (N−1)-bit digital signals, by control of a first clock signal and a second clock signal; and an amplifying circuit for sampling and holding the first and second analog voltage with reference to the first and second clock signals to generate a glitch-removed signal.

The N-bit digital signal is established to be the sum of the two (N−1)-bit digital signals.

The first and second clock signals have inverted phases with respect to each other.

The amplifying circuit comprises an amplifier having a positive terminal coupled to the ground voltage; a sampling capacitor having a first terminal coupled to a negative terminal of the amplifier, and a second terminal coupled in common to a first switch and a second switch controlled by the clock signals; a holding capacitor having a first terminal coupled to the negative terminal of the amplifier, and a second terminal coupled to an output terminal of the amplifier; a third switch, coupled in parallel to the holding capacitor, for determining a time sampled to the sampling capacitor; and a fourth switch coupled in series to the output terminal of the amplifier.

The current-steering DAC further comprises an output buffer for buffering an analog voltage output by the amplifying circuit and outputting a final output voltage.

In another aspect of the present invention, a current-steering digital-to-analog converter (DAC) comprises M ($=2^{N-1}$) first current cell groups for supplying a current based on an (N−1)-bit digital signal from among an N-bit digital signal; a second current cell for supplying a current based on the least significant bit (LSB) from among the N-bit digital signal; a current cell driver for generating analog voltages corresponding to the current provided by the first and second current cells, by control of a first clock signal and a second clock signal; and an amplifying circuit for sampling and holding the analog voltages with reference to the first and second clock signals, and outputting result signals.

The (N−1)-bit digital signal generated by excluding the LSB from the N-bit digital signal is output in the phase of the first clock signal, and the inverted (N−1)-bit digital signal is output in the phase of the second clock signal.

The LSB is an LSB of the N-bit digital signal in the phase of the first clock signal, and the LSB is established to be 0 in the phase of the second clock signal.

In still another aspect of the present invention, a current-steering digital-to-analog converter (DAC) comprises M ($=2^{N-1}$) first current cell groups for supplying a current based on an (N−1)-bit digital signal and an inverted signal thereof from among an N-bit digital signal; a second current cell for supplying a current based on the least significant bit (LSB) and an inverted signal thereof from among the N-bit digital signal; a differential current cell driver for generating a first analog voltage and a second analog voltage corresponding to the currents provided by the first and second current cells, by control of a first clock signal and a second clock signal; and a differential amplifying circuit for sampling and holding the first and second analog voltages with reference to the first and second clock signals, and outputting glitch-removed signals.

The (N−1)-bit digital signal generated by excluding the LSB from the N-bit digital signal is output in the phase of the first clock signal, and the inverted (N−1)-bit digital signal is output in the phase of the second clock signal.

The LSB is established to be 0 in the phase of the first clock signal, and the LSB is an inverted LSB of the N-bit digital signal in the phase of the second clock signal.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 4 shows digital signals for each clock signal's phase in the circuit of FIG. 3;

FIG. 6 shows digital signals for each clock signal's phase in the circuit of FIG. 5.

DETAILED DESCRIPTION OF THE PREFERRED EMBODIMENTS

Figure 1:
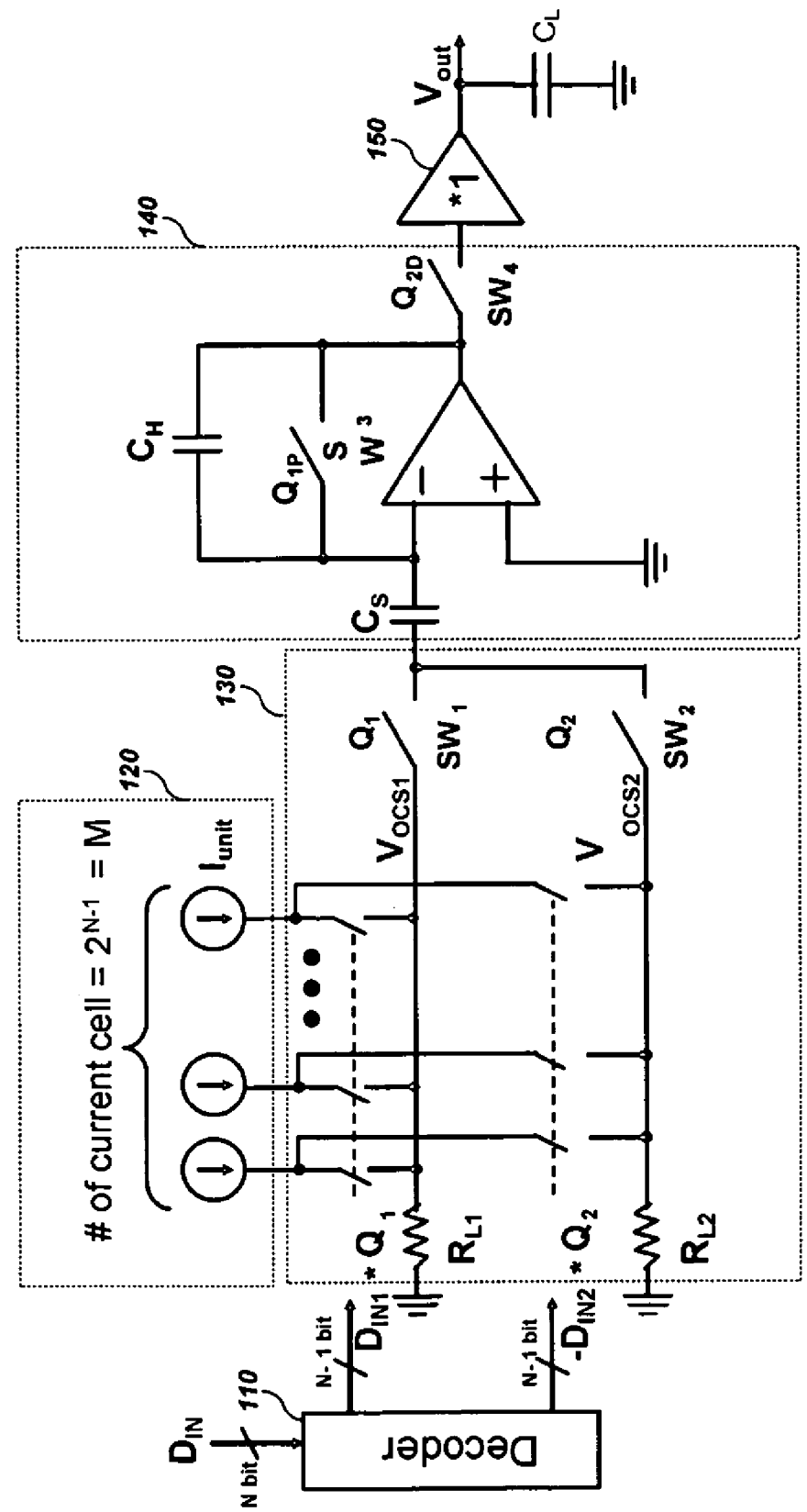
FIG. 1 shows a circuit diagram for a current-steering DAC according to an exemplary embodiment of the present invention.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

FIG. 1 shows a circuit diagram for a current-steering DAC according to an exemplary embodiment of the present invention.

Referring to FIG. 1, the DAC includes a decoder 110 for converting N-bit digital signals $D_{IN}$ into (N−1)-bit $D_{IN1}$ and $D_{IN2}$; M current cells 120 for functioning as current sources; a current cell driver 130 for varying currents flowing to loads $R_{L1}$ and $R_{L2}$ according to the (N−1)-bit digital signals $D_{IN1}$ and $D_{IN2}$, and outputting analog voltages $V_{OCS1}$ and $V_{OCS2}$ corresponding to the varied currents; and an amplifying circuit 140 for sampling and holding the analog voltages $V_{OCS1}$ and $V_{OCS2}$ at the clock signals' phases $Q_1$ and $Q_2$, and may further include an output buffer 150 for buffering the amplified analog voltages and outputting a final output voltage $V_{OUT}$.

The current cell driver 130 includes a first switch $SW_1$, and a second switch $SW_2$ switched by the phases $Q_1$ and $Q_2$, and the amplifying circuit 140 includes an amplifier 141, a sampling capacitor $C_S$, a holding capacitor $C_H$, a third switch $SW_3$, and a fourth switch $SW_4$.

In detail, the amplifying circuit 140 includes an amplifier 141 having both terminals coupled to the ground voltage; a sampling capacitor $C_S$ having a first terminal coupled to a negative terminal of the amplifier 141 and a second terminal coupled in common to the first and second current cell switches $SW_1$ and $SW_2$; a holding capacitor $C_H$ having a first terminal coupled to the negative terminal of the amplifier and a second terminal coupled to an output terminal of the amplifier; a third switch $SW_3$ coupled in parallel to the holding capacitor $C_H$ and determining a time to be sampled to the sampling capacitor $C_S$; and a fourth switch $SW_4$ coupled in series to the amplifier.

The analog voltages $V_{OCS1}$ and $V_{OCS2}$ corresponding to the currents flowing to the loads $R_{L1}$ and $R_{L2}$ by the (N–1)-bit digital values $D_{IN1}$ and $D_{IN2}$ for the respective clock signals' phases in the DAC are given as $V_{OCS1}=D_{IN1}\times I_{unit}\times R_{L1}$ and $V_{OCS2}=-D_{IN2}\times I_{unit}\times R_{L2}$. Here, the (N–1)-bit digital input signals $D_{IN1}$ and $D_{IN2}$ coupled to the M current cells 120 are not concurrently turned on since the phases $Q_1$ and $Q_2$ of the clock signals are inverted with respect to each other.

When the loads $R_{L1}$ and $R_{L2}$ are assumed to correspond to each other, the final output voltage $V_{OUT}$ is given to satisfy the equation: $V_{OUT}=(C_H/C_S)\times(V_{OCS1}-V_{OCS2})=(C_H/C_S)\times(D_{IN1}+D_{IN2})\times I_{unit}\times R_L$.

Therefore, when the initial digital input $D_{IN}$ of the DAC is established to be $D_{IN}=D_{IN1}+D_{IN2}$, the final output corresponding to 2M voltage levels are obtained by using M current cells. In detail, N-bit digital inputs are converted into analog signals through $2M (=2^N)$ current cells in the prior art, but the final outputs corresponding to 2M voltage levels are generated by using $M (=2^{N-1})$ current cells in the exemplary embodiment, and thereby, the resolution corresponding to one bit is extended.

Figure 2:
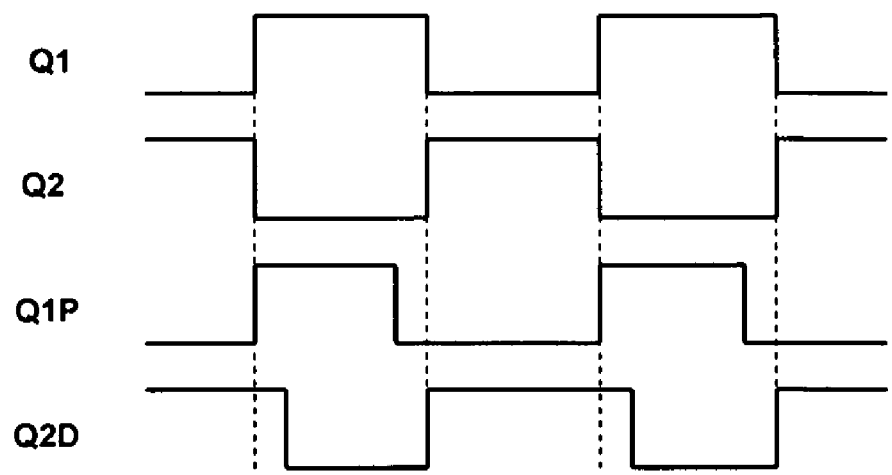
FIG. 2 shows phases of clock signals of the current-steering DAC according to an exemplary embodiment of the present invention.

FIG. 2 shows phases of clock signals of the current-steering DAC according to an exemplary embodiment of the present invention, illustrating the phases of clock signals for driving the switches $SW_1$ to $SW_4$ shown in FIG. 1.

The clock signals $Q_1$ and $Q_2$ for driving the switches $SW_1$ and $SW_2$ coupled to the sampling capacitor $C_S$ of the amplifying circuit 140 have inverted phases with respect to each other, and a signal $Q_{1p}$ for driving the switch $SW_3$ for determining the time sampled to the sampling capacitor $C_S$ is controlled to be switched to a logical low value before the signal $Q_1$ is switched thereto, thereby minimizing the influence caused by switching noise generated by the switches $SW_1$ and $SW_2$ and maintaining a constant sampling time irrespective of input signal levels.

Also, a signal $Q_{2D}$ for driving the switch $SW_4$ coupled to the output buffer 150 is controlled to be switched to a logical high value after the signal $Q_2$ is switched thereto, thereby minimizing the influence caused by switching noise generated by the switches $SW_1$ and $SW_2$ and minimizing the stabilization time of output signals.

In detail, the (N–1)-bit digital inputs $D_{IN1}$ and $D_{IN2}$ are generated by assigning the least significant bit (LSB) of the N-bit digital input $D_{IN}$ as a parity bit. That is, when the LSB of the digital input $D_{IN}$ is assigned as a parity bit, other bits except the LSB are output to digital bit terminals $D_{IN1}$ and $D_{IN2}$ when the parity bit of the LSB is given as 0, and other bits except the LSB are output to the digital bit terminal $D_{IN1}$ and the addition of 1 to $D_{IN1}$ is output to the digital bit terminal $D_{IN2}$ when the parity bit of the LSB is given as 1.

For example, when an input signal of 1010 is provided by a 4-bit DAC, the signals $D_{IN1}$ and $D_{IN2}$ have the signal of 101 since the parity bit of the LSB is 0. When an input signal of 1011 is provided, the residual bits of 101 except the LSB are output to the terminal of $D_{IN1}$, and the output of 110 generated by adding 1 to the signal $D_{IN1}$ is provided to the terminal of $D_{IN2}$.

Actually, when an N-bit digital input signal with the LSB as a parity bit is provided to the decoder 110, the input signal is converted into 2 (N–1)-bit digital signals which are then converted into analog signals which respectively correspond to the M current cells 120 and the loads.

As a result, the currents flowing to the M current cells 120 and the loads are varied by the two (N–1)-bit digital signals, and analog voltages corresponding to the varied currents are output, and therefore, final outputs corresponding to 2M voltage levels are generated by using M current cells compared to the conventional DAC, and the final output voltage is extended with 1-bit resolution.

Figure 3:
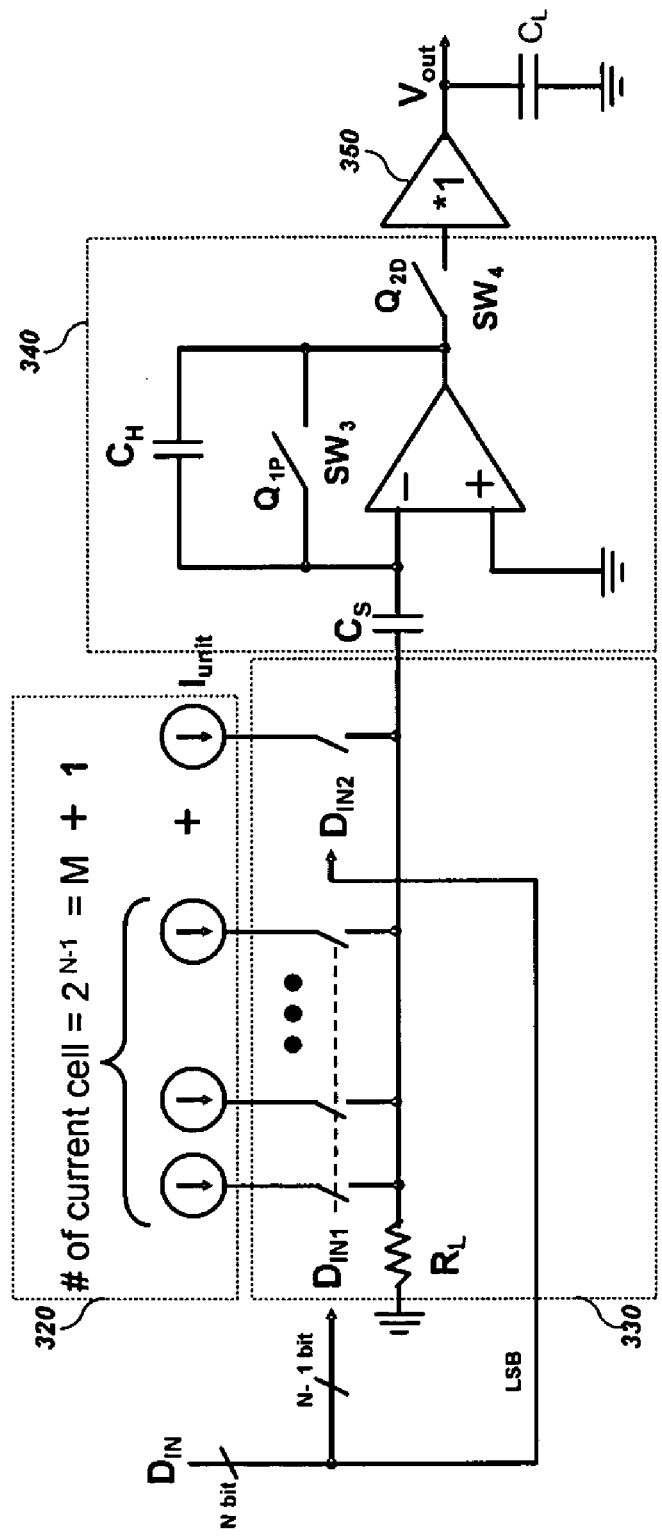
FIG. 3 shows a circuit diagram for a current-steering DAC according to another exemplary embodiment of the present invention.

The current-steering DAC of FIG. 1 can be simplified as in FIG. 3.

FIG. 3 shows a circuit diagram for a current-steering DAC according to another exemplary embodiment of the present invention.

Referring to FIG. 3, digital inputs for the phases are controlled to be different instead of differently coupling the switches to the sampling capacitor $C_S$ for the phases $Q_1$ and $Q_2$. This realization allows usage of the same load and switch for each load to thus prevent degradation of resolution caused by mismatch of elements and provide simple implementation of digital inputs $D_{IN1}$ and $D_{IN2}$. The DAC includes a current source 320 with $(M+1 (=2^{N-1}+1))$ current cells, a current cell driver 330, an amplifying circuit 340, and an output buffer 350.

FIG. 4 shows current cell driving signals $D_{IN1}$ and $D_{IN2}$ for respective phases of FIG. 3. The terminal of $D_{IN1}$ outputs the digital signal of $D_{IN}$ except the LSB thereof in the case of the phase of $Q_1$, and outputs the inverted digital signal of $D_{IN1}$ in the case of the phase of $Q_2$. In this instance, the terminal of $D_{IN2}$ outputs the LSB of the signal of $D_{IN}$ in the case of the phase of $Q_1$, and outputs the value of 0 in the case of the phase of $Q_2$.

For example, in Case I, when the signal of $D_{IN}$ is binary data of 10010011, the terminal of $D_{IN1}$ outputs a digital signal of 1001001 except 1, the LSB of $D_{IN}$ in the case of the phase of $Q_1$, and outputs an inverted digital signal of 0110110 in the case of the phase of $Q_2$, and in this instance, the terminal of $D_{IN2}$ outputs 1, the LSB of $D_{IN}$ in the case of the phase of $Q_1$, and outputs 0 in the case of the phase of $Q_2$.

In Case II, when the signal of $D_{IN}$ is binary data of 10010010, the terminal of $D_{IN1}$ outputs a digital signal of 1001001 except 0, the LSB of $D_{IN}$ in the case of the phase of $Q_1$, and outputs an inverted digital signal of 0110110 in the case of the phase of $Q_2$, and in this instance, the terminal of $D_{IN2}$ outputs 0, the LSB of $D_{IN}$ in the case of the phase of $Q_1$, and outputs 0 in the case of the phase of $Q_2$.

Therefore, the final output voltage $V_{OUT}$ is found below: $V_{OUT}=(C_H/C_S)\times(D_{IN1}+D_{IN1}+D_{IN2})\times I_{unit}\times R_L=(C_H/C_S)\times D_{IN}\times I_{unit}\times R_L$ as given with reference to FIG. 1.

Figure 5:
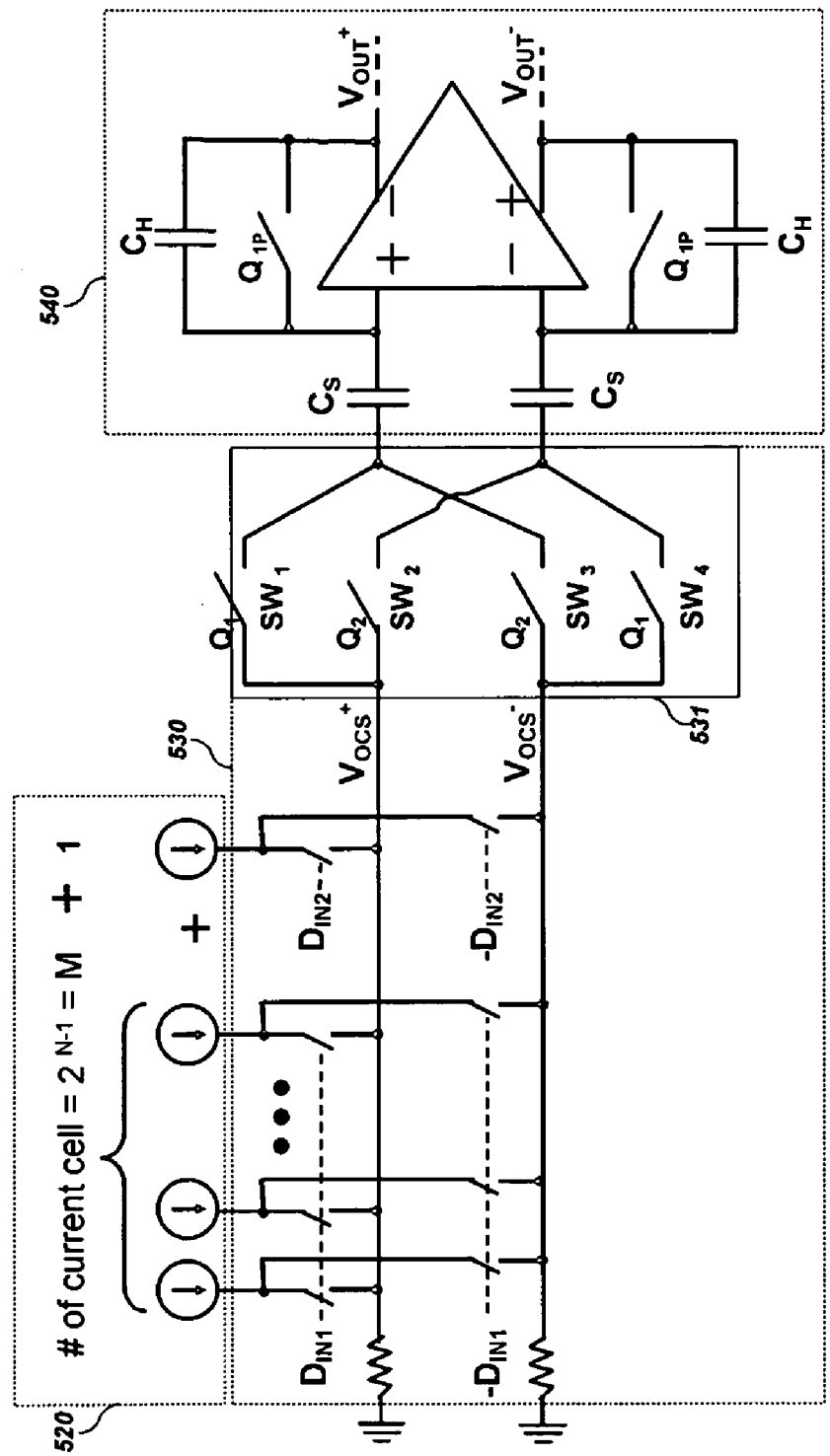
FIG. 5 shows a differential circuit diagram of the current-steering DAC according to an exemplary embodiment of the present invention.

FIG. 5 shows a differential circuit diagram of the current-steering DAC of FIG. 3, and FIG. 6 shows digital signals for each clock signal's phase in the circuit of FIG. 5. The DAC includes a current source 520, a differential current cell driver 530 including a differential current cell switch 531, and a differential amplifying circuit 540.

Referring to FIGS. 5 and 6, the terminal of $D_{IN1}$ outputs digital signals except the LSB of $D_{IN}$ in the case of the phase of $Q_1$, and outputs inverted signals in the case of the phase of $Q_2$. The terminal of $D_{IN2}$ outputs 0 in the case of the phase of Q1, and outputs signals with the inverted LSB of DIN. Therefore, the final output voltage $V_{OUT}$ is given to satisfy the equation of $V_{OUT}=(C_H/C_S)\times(D_{IN1}+D_{IN1}+D_{IN2})\times I_{unit}\times R_L=(C_H/C_S)\times D_{IN}\times I_{UNIT}\times R_L$.

As a result, the signals DIN1 and DIN2 for driving the current cells are used to represent the signal of DIN and vary driving signals according to respective phases of control signals, thereby improving additional 1-bit resolution irrespective of mismatch of elements between the same current sources.

The DAC samples the final stabilized voltage and amplifies the same, and hence, the linearity of the output signal is determined by the linearity of the final output buffer irrespective of glitches generated when the output by the DAC is varied.

Referring again to FIGS. 1, 3, and 5, FIG. 1 shows a DAC for providing a sample-and-hold amplifier to the output terminal of the current-steering DAC and minimizing glitches of output signals, FIG. 3 shows a DAC for providing an additional current cell, varying a digital value of each phase of a current cell switch driving signal, and combining varied values to extend the resolution of analog outputs by 1 bit, and FIG. 5 shows a differential DAC for providing an additional current cell, varying a digital value of each phase of a current cell switch driving signal, and combining varied values to extend the resolution of analog outputs by 1 bit.

Accordingly, the current-steering DAC improves additional 1-bit resolution irrespective of mismatch, uses no decoder for converting thermometer codes used by general current-steering DACs for minimization of glitch, and uses no resistors with low resistance for reducing a stabilization time of current cell output signals.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

According to the present invention, the resolution of final output signals is extensible by providing an additional circuit to the output terminal of the conventional DAC and varying output values of the current-steering DAC for the respective phases of clock signals.

Also, current consumption is reduced by minimizing the glitches generated at the output terminal of the general current-steering DAC according to an additional circuit.

What is claimed is:

1. A current-steering digital-to-analog converter (DAC) comprising:
    a decoder for receiving an N-bit digital input signal and converting the same into a first (N–1)-bit digital signal and a second (N–1)-bit digital signal;
    M ($=2^{N-1}$) current cells for supplying the current
    a current cell driver including a first switch group responsive to the first (N–1)-bit digital signal and a second switch group responsive to the second (N–1)-bit digital signal, and generating a first analog voltage corresponding to the first (N–1)-bit digital signals, wherein the first switch group includes a plurality of switches coupled to the M current cells and the second switch group includes a plurality of switches coupled to the M current cells; and
    an amplifying circuit for sampling and holding the first analog voltage and the second analog voltage with reference to a first clock signal and a second clock signal to generate a glitch-removed signal.

2. The current-steering DAC of claim 1, wherein the N-bit digital signal is established to be the sum of the two (N–1)-bit digital signals.

3. The current-steering DAC of claim 1, wherein the first and second clock signals have inverted phases with respect to each other.

4. The current-steering DAC of claim 3, wherein digital values of the clock signals for the respective phases are changed to extend one bit of the resolution of analog outputs with respect to the N-bit digital signal.

5. The current-steering DAC of claim 1, wherein the amplifying circuit comprises:
    an amplifier having a positive terminal coupled to a ground voltage;
    a sampling capacitor having a first terminal coupled to a negative terminal of the amplifier, and a second terminal coupled in common to a first switch and a second switch controlled by the clock signals;
    a holding capacitor having a first terminal coupled to the negative terminal of the amplifier, and a second terminal coupled to an output terminal of the amplifier;
    a third switch, coupled in parallel to the holding capacitor, for determining a time sampled to the sampling capacitor; and
    a fourth switch coupled in series to the output terminal of the amplifier.

6. The current-steering DAC of claim 5, wherein a signal for driving the third switch is switched to a logical low value before the first clock signal is switched thereto in order to maintain the sampling time irrespective of an input signal level.

7. The current-steering DAC of claim 5, wherein a signal for driving the fourth switch is switched to a logical high value after the second clock signal is switched thereto in order to reduce a stabilizing time for an output signal.

8. The current-steering DAC of claim 1, further comprising an output buffer for buffering an analog voltage output by the amplifying circuit and outputting a final output voltage.

9. The current-steering DAC of claim 1, wherein the least significant bit (LSB) of the N-bit digital signal is assigned as a parity bit in the (N–1)-bit digital signals.

10. The current-steering DAC of claim 9, wherein the bits except the LSB are output to be (N–1)-bit digital signals when the parity bit of the LSB of the N-bit digital signal is given to be 0, and the residual bits except the LSB are output to a terminal of the first (N–1) digital signal and the addition of 1 to the first (N–1) digital signal is output to a terminal of the second (N–1) digital signal when the parity bit of the LSB is given to be 1.

11. A current-steering digital-to-analog converter (DAC) comprising:
    a current cell group including M ($=2^{N-1}$) current cells and supplying a current based on an (N–1)-bit digital signal from among an N-bit digital signal;
    a first current cell for supplying a current based on the least significant bit (LSB) from among the N-bit digital signal;
    a current cell driver;
    including a switch group responsive to the (N–1)-bit digital signal and a first switch responsive to the LSB, and which generates an analog voltage corresponding to the current provided by the current cell group and the first current cell, wherein the switch group includes a plurality of switches coupled to the M current cells of the current cell group and the first switch is coupled to the first current cell; and
    an amplifying circuit for sampling and holding the analog voltages with reference to a first clock signal and a second clock signal, and outputting result signals.

12. The current-steering DAC of claim 11, wherein the (N−1)-bit digital signal generated by excluding the LSB from the N-bit digital signal is output in the phase of the first clock signal, and the inverted (N−1)-bit digital signal is output in the phase of the second clock signal.

13. The current-steering DAC of claim 11, wherein the LSB is an LSB of the N-bit digital signal in the phase of the first clock signal, and the LSB is established to be 0 in the phase of the second clock signal.

14. A current-steering digital-to-analog converter (DAC) comprising:

a current cell group including M ($=2^{N-1}$) current cells and supplying a current based on an (N−1)-bit digital signal and an inverted signal thereof from among an N-bit digital signal;

a first current cell for supplying a current based on the least significant bit (LSB) and an inverted signal thereof from among the N-bit digital signal;

a differential current cell driver for generating a first analog voltage and a second analog voltage corresponding to the currents provided by the first and second current cells; and a differential amplifying circuit for sampling and holding the first and second analog voltages with reference to a first and second clock signal and a second clock signal, and outputting glitch-removed signals.

15. The current-steering DAC of claim 14, wherein the (N−1)-bit digital signal generated by excluding the LSB from the N-bit digital signal is output in the phase of the first clock signal, and the inverted (N−1)-bit digital signal is output in the phase of the second clock signal.

16. The current-steering DAC of claim 14, wherein the LSB is established to be 0 in the phase of the first clock signal, and the LSB is an inverted LSB of the N-bit digital and signal in the phase of the second clock signal.

* * * * *